(12) United States Patent
Park et al.

(10) Patent No.: US 11,923,819 B2
(45) Date of Patent: Mar. 5, 2024

(54) WIDEBAND SIGNAL ATTENUATOR

(71) Applicant: MEDIATEK Singapore Pte. Ltd., Singapore (SG)

(72) Inventors: Henry Arnold Park, San Jose, CA (US); Tamer Mohammed Ali, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/744,163

(22) Filed: May 13, 2022

(65) Prior Publication Data

US 2022/0407490 A1 Dec. 22, 2022

Related U.S. Application Data

(60) Provisional application No. 63/213,305, filed on Jun. 22, 2021.

(51) Int. Cl.
| | |
|---|---|
| *H03H 7/24* | (2006.01) |
| *H03G 1/00* | (2006.01) |
| *H03G 3/30* | (2006.01) |
| *H03H 11/24* | (2006.01) |

(52) U.S. Cl.
CPC ............ *H03H 7/24* (2013.01); *H03G 1/007* (2013.01); *H03G 3/30* (2013.01); *H03H 11/245* (2013.01)

(58) Field of Classification Search
CPC ............ H03H 7/24; H03H 7/25; H03H 7/253; H03H 7/255; H03H 7/256; H03H 11/245; H03H 11/24; H01P 1/22; H01P 1/227; H03G 1/007; H03G 3/30; H03G 3/18
See application file for complete search history.

(56) References Cited

U.S. PATENT DOCUMENTS

| | | | |
|---|---|---|---|
| 7,834,797 B2 * | 11/2010 | Iida | H03H 19/004 341/172 |
| 9,531,359 B1 | 12/2016 | Shrivastava | |
| 10,305,450 B2 | 5/2019 | Mu et al. | |
| 2011/0002080 A1 | 1/2011 | Ranta | |
| 2017/0302316 A1 | 10/2017 | Chu et al. | |
| 2018/0019721 A1 | 1/2018 | Sharma | |

FOREIGN PATENT DOCUMENTS

| | | |
|---|---|---|
| EP | 3 428 658 A1 | 1/2019 |
| TW | 2018/41466 A | 11/2018 |
| WO | WO 2020/094037 A1 | 5/2020 |

OTHER PUBLICATIONS

Extended European Search Report for European Application No. 22180247.3 dated Nov. 23, 2022.

\* cited by examiner

*Primary Examiner* — Stephen E. Jones
(74) *Attorney, Agent, or Firm* — Wolf, Greenfield & Sacks, P.C.

(57) ABSTRACT

Disclosed herein are embodiments of a wide bandwidth attenuator circuit having a tunable gain and tunable input impedance. In some embodiments, the wideband attenuator circuit comprises a serial capacitor shunted to ground by a plurality of circuit slices that are connected in parallel and switchably coupled to the output node of the attenuator. Each circuit slice has a tunable resistor that can be set to a conductive state ("enabled") or a high impedance state ("disabled") The number of enabled circuit slices that are connected in parallel may be used to program the attenuator gain and the attenuator impedance.

20 Claims, 7 Drawing Sheets

WIDEBAND SIGNAL ATTENUATOR

CROSS-REFERENCE TO RELATED APPLICATIONS

This application claims the benefit under 35 U.S.C. 119(e) of U.S. Patent Application Ser. No. 63/213,305, filed Jun. 22, 2021, entitled "WIDEBAND SIGNAL ATTENUATOR BY PASSIVE ELEMENT NETWORK," which is hereby incorporated herein by reference in its entirety.

BACKGROUND

The present application relates generally to an attenuator circuit. In particular, it relates to a programmable attenuator circuit that can be used with signals of a wide frequency range.

An attenuator is a circuit that is used to alter a characteristic of an electrical signal. An attenuator can be characterized by an attenuator gain that is defined by a ratio between a characteristic of the output signal and a characteristic of the input signal. For example, the attenuator gain may be a voltage gain, defined by the ratio between the voltage amplitude of the output signal versus the input signal. The attenuator gain may be a power gain, defined by the ratio between the power of the output signal versus the input signal. The attenuator gain may also be a complex number representative of the complex transfer function between the output signal and the input signal. The attenuator gain is applied in proportion to the time-varying input signal, such that the modulated information represented by the waveform of the input signal is retained in the output signal, even though the output signal has a different amplitude or power compared to the input signal.

One application of an attenuator is in a communication device having a transmitter and a receiver. A receiver may have a first stage component that can be any one of an amplifier, an equalizer, or a buffer. An amplifier may be a conventional amplifier in the sense that it provides a signal gain across a wide range of frequency band. An equalizer may be a continuous-time linear equalizer (CTLE) that selectively amplifies or attenuates signals in a certain frequency band. A buffer may be a circuit having substantially unitary amplification. Regardless of the nature of the first stage component in the receiver, the component may have a limited dynamic range for linear amplification of an input signal. For example, an amplifier may no longer has a linear gain when a high-powered signal having an amplitude beyond a dynamic range is received, which leads to distortion. In digital communication systems, such distortion may lead to a high bit error rate (BER) when the signal from the amplifier is further processed to extract digital information. An attenuator may be provided in the receiver to adjust or "condition" a signal from the transmitter before the signal is processed by the amplifier in the receiver such that the attenuated signal has an amplitude or power that is in the optimum or desirable range for the subsequent circuitry.

FIG. 1 shows a generalized block diagram of an electronic communication system 100 that includes an attenuator circuit 120. Attenuator circuit 120 may be used to alter a characteristic of an input signal 121 received from a transmitter 110 at an input node 122 to the attenuator circuit, and to provide an output signal 123 at an output node 124 for an amplifier 130. The attenuator circuit 120 and amplifier 130 may be part of a receiver 150. In FIG. 1, V1 and R1 are the Thevenin equivalent voltage and Thevenin equivalent resistance, respectively, representing the transmitter 110. In such examples, attenuator circuit 120 may alter or attenuate the amplitude or power of input signal 121 such that output signal 123 has a different, and usually lower amplitude or power that is more suitable for operation of the amplifier 130.

SUMMARY

Disclosed herein are embodiments of a wide bandwidth attenuator circuit having a tunable gain and tunable input impedance. In some embodiments, the wideband attenuator circuit comprises a serial capacitor shunted to ground by a plurality of circuit slices that are connected in parallel and switchably coupled to the output node of the attenuator. Each circuit slice has a tunable resistor that can be set to a conductive state ("enabled") or a high impedance state ("disabled") The number of enabled circuit slices that are connected in parallel may be used to program the attenuator gain and the attenuator impedance.

In some embodiments, an attenuator circuit is provided. The attenuator circuit comprises an input node; an output node; and a plurality of circuit slices connected in parallel between the output node and a reference voltage node, individual circuit slices of the plurality of circuit slices comprising a capacitor in series with a tunable resistor.

In some embodiments, an electronic device is provided. The electronic device comprises an attenuator having a gain between an attenuator output and an attenuator input. The attenuator comprises a plurality of circuit slices connected in parallel between the attenuator output and a reference voltage node, individual circuit slices of the plurality of circuit slices comprising a capacitor in series with a transistor having a tunable resistance.

In some embodiments, a method for operating an attenuator circuit is provided. The attenuator circuit has an input, an output, and a plurality of circuit slices connected in parallel between the output and a reference voltage node, individual circuit slices of the plurality of circuit slices having a capacitor in series with a transistor having a tunable resistance. The method comprises selectively tuning the transistor in some or all circuit slices of the plurality of circuit slices to a conductive state to adjust an attenuator gain of the attenuator circuit.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

High-speed electronic communication systems that use either a wireline or wireless communication link are often operated to handle data signals of a wide range of frequencies, and of a wide range of data transfer rates.

One type of attenuator may include a resistive Pi-network, in which a series resistor is shunted to a reference voltage node such as ground via two shunt resistors on both terminals of the series resistor. The Pi-network creates a resistive voltage divider such that the output signal at one terminal of the series resistor is attenuated compared to the input signal at the other terminal of the series resistor. However, because a series resistor in the Pi-network is present between the input node and output node, the associated RC delay significantly limits the bandwidth of such an attenuator such that the attenuator gain may significantly decrease at high frequency even if the attenuator is disabled (0 dB).

Figure 1:
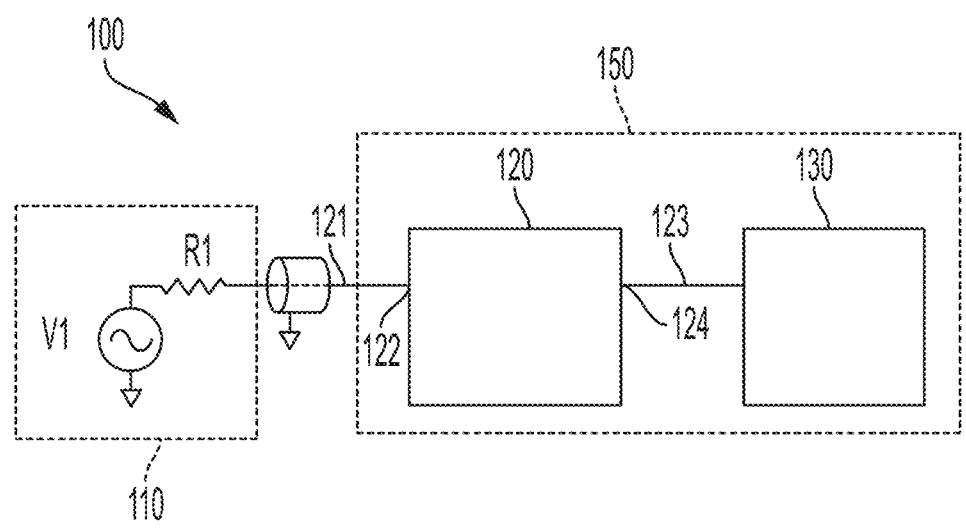
FIG. 1 is a high level block diagram illustrating an attenuator circuit as used in an electronic device.

Another type of attenuator may include a capacitive attenuator which forms a voltage divider by a serial capacitor shunted to ground via a shunt capacitor. There are at least two different reasons how such an attenuator may suffer from signal quality degradations: signal loss by R-C bandwidth limits and waveform reflections by impedance mismatch. While the serial capacitor eliminates the serial resistor, the capacitive attenuator still limits the bandwidth of such an attenuator at high frequency operation for a different reason. Because the input node is coupled to ground with a large parasitic shunt capacitance, the transmitted signal from transmitter 110 in FIG. 1 leaks to the ground by an increasingly small capacitive impedance at increasingly high frequency that leads to a smaller swing. Moreover, an impedance mismatch may cause signal reflections at the attenuator input, which decreases signal quality.

The inventors have recognized and appreciated the limitations of some attenuators such as those described above, and the need to provide an attenuator circuit that operates across a wide range of bandwidth, including at both low frequencies and high frequencies of more than 40 GHz or more than 100 GHz. It is further desirable for an attenuator circuit in a receiver to minimize impedance mismatch to that of the transmitter to reduce signal reflection.

Disclosed herein are examples of a wideband attenuator circuit that provides a programmable attenuator gain for signals across a wide bandwidth including frequencies of more than 40 GHz or more than 100 GHz. According to some aspects, the wideband attenuator circuit may also provide a programmable input impedance.

In one aspect, the wideband attenuator circuit comprises a serial capacitor shunted to ground by a plurality of circuit slices that are connected in parallel and switchably coupled to the output node of the attenuator. At low frequencies, attenuation is provided by a capacitor voltage divider network. The attenuator gain is programmable by adjusting a tunable resistor in each circuit slice between a high impedance state and a conductive state having a predetermined resistance. The high impedance state may, in some examples, be an open circuit. A circuit slice with a tunable resistor set to the conductive state may be referred to as being "enabled" or "activated," while a circuit slice with a tunable resistor set to the high impedance state may be referred to as being "disabled" or "deactivated." The number of enabled circuit slices that are connected in parallel may be used to program the attenuator gain.

At high frequencies, the serial capacitor and capacitors within each circuit slice behaves as a near-short. The attenuator output node is shunted to ground by parallel combination of the resistance within each circuit slice.

In one aspect, the tunable resistor in each circuit slice may be implemented as a tunable resistance of a transistor that can be adjusted by an analog gate voltage. The resistance may be adjustable to a predetermined value based on the analog gate voltage, such that the high-frequency attenuator gain of the wideband attenuator circuit may be programmed by both the number N of circuit slices that are activated, and the resistance within one circuit slice.

In one aspect, because there is no serial resistor coupled between the input node and output node, at high frequency the bandwidth limitation associated with RC delay in a resistive Pi-network can be eliminated.

In another aspect, even though at high frequency capacitors in each circuit slice behaves as a near-short, the output node is nevertheless coupled to ground with a resistance such as the on-state resistance of the transistor in series with the capacitor. As a result, the high frequency impedance mismatch in a capacitive attenuator can be eliminated.

According to one aspect, the wideband attenuator circuit disclosed herein may provide a substantially constant attenuator gain across a wide range of frequencies. In some embodiments, the high frequency attenuator gain may be programmed by adjusting predetermined resistances of the transistors in the circuit slices such that the high frequency attenuator gain is at a predetermined level, for example matching the attenuator gain of the same wideband attenuator circuit at low frequencies.

In some embodiments, the attenuator gain may be substantially constant such that it varies by no more than 1 dB between a low frequency and a high frequency. The low frequency may be less than 1 GHz, or less than 0.1 GHz, and the high frequency may be more than 0.1 GHz, more than 1 GHz, more than 10 GHz, more than 100 GHz, or between 0.1 GHz and 1,000 GHz.

In one aspect, predetermined resistance of the transistors within each circuit slice may be adjusted by applying a predetermined analog voltage to a gate terminal of the transistor. In some embodiments, the gate terminal of the transistor within each slice may be coupled by one or more switches to an enable gate voltage and a disable gate voltage. The one or more switches are controlled to selectively couple the gate terminal to the enable/disable gate voltage to place enable/disable the circuit slice. The enable gate voltage and disable gate voltage may be analog voltage values that are calibrated to cause the transistor to have a desired resistance.

The aspects and embodiments described above, as well as additional aspects and embodiments, are described further below. These aspects and/or embodiments may be used individually, all together, or in any combination of two or more, as the disclosure is not limited in this respect.

Figure 2:
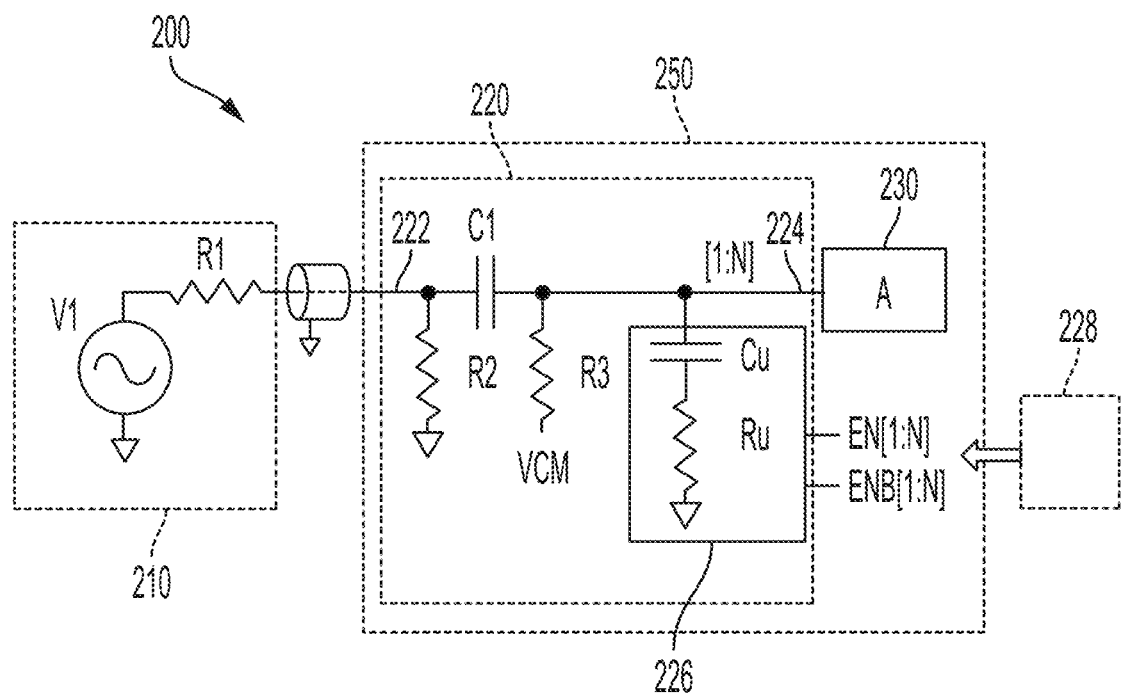
FIG. 2 shows a schematic circuit diagram of an electronic device having an attenuator circuit, in accordance with some embodiments.

FIG. 2 shows a schematic circuit diagram of an electronic device having an attenuator circuit, in accordance with some embodiments. In FIG. 2, electronic device 200 includes an attenuator circuit 220 having an input node 222 coupled to a circuit 210, and an output node 224 coupled to an amplifier 230. Attenuator circuit 220 and amplifier 230 may, in some embodiments, be part of a receiver 250, and circuit 210 may be a transmitter, although embodiments of the present application are not so limited and aspects of the attenuator circuit disclosed herein may be used standalone. Thevenin equivalent resistance R1 for transmitter 210 may be approximately 50Ω in some embodiments. In some embodiments, electronic device 200 may be a wireline transceiver and transmitter 210 and receiver 250 may communicate through direct electrical connection through conductors within the device 200. Any suitable ways now known or becoming known in the future to construct a wireline transceiver may be used to implement device 200 in such examples. In some examples, electronic device 200 may comprise a high-speed serial link having a data bandwidth of at least 10 Gbps, at least 100 Gbps, at least 112 Gbps. In one non-limiting example, electronic device 200 may comprise a wired ethernet link based on the IEEE 802.3 protocol.

It should be appreciated that while FIG. 2 shows circuit 210 and receiver 250 as single-ended circuits, embodiments of the present application may also include differential signaling schemes and related circuit designs. In embodiments with differential signals, FIG. 2 may illustrate circuitry for "half" of differential signal lines for purpose of simplicity. In such examples, the ground in FIG. 2 may represent a small signal ground, rather than a true ground from a power supply. Similarly, embodiments illustrated in figures throughout this application may equally apply to single-ended circuits or for one half of a circuit handling differential signals.

Referring to FIG. 2, attenuator circuit 220 includes AC coupling capacitor C1 that is coupled to both input node 222 and output node 224. R2 is coupled between the input node 222 and ground, and represents the equivalent input impedance of receiver 250, and may be approximately 50Ω in some embodiments. R3 represents a DC biasing resistance, and is coupled between output node 224 and a common mode voltage VCM. For example, VCM may be a constant voltage level that is selected based on a preferred common mode voltage level for amplifier 230. In some embodiments R3 may be larger than R2.

Still referring to FIG. 2, attenuator circuit 220 further includes a group of N circuit slices 226 that are connected in parallel. N is an integer and may be between 1 and 10, between 10 and 50, between 10 and 100, and between 10 and 1000, as aspects of the present application are not so limited. Each circuit slice has a capacitor Cu and a tunable resistor Ru in series between output node 224 and ground. For each of the N circuit slices, an enable signal EN and a disable signal ENB may be received from a controller 228 may to control the tunable resistor Ru to be in one of at least two states: a high impedance state when disabled by the ENB signal, and a conductive state with a predetermined resistance when enabled by the EN signal.

Figure 3A:
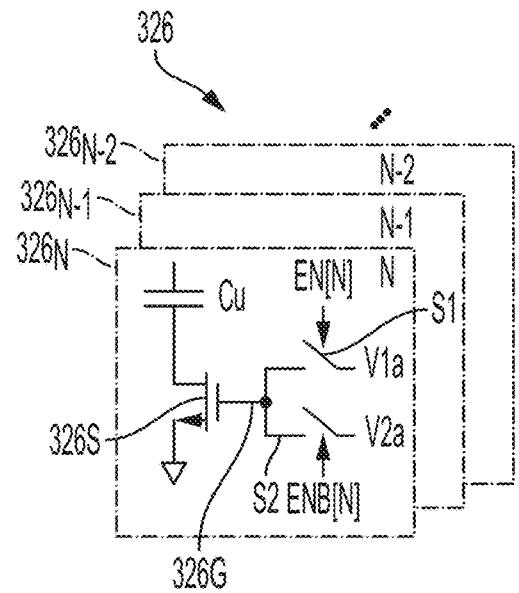
FIG. 3A shows a schematic circuit diagram of an exemplary implementation of circuit slices using transistors that can be used as the group of circuit slices in FIG. 2, in accordance with some embodiments.

FIG. 3A shows a schematic circuit diagram of an exemplary implementation of circuit slices using transistors that can be used as the group of circuit slices in FIG. 2, in accordance with some embodiments. In FIG. 3A, a group of circuit slices 326 includes N circuit slices $326_N$, $326_{N-1}$, $326_{N-2}$ ... $326_1$. Each circuit slice includes a capacitor Cu in series with a transistor 326S. As shown, transistor 326S is a N-channel metal-oxide semiconductor transistor (NMOS), with its source terminal coupled to ground, and drain terminal coupled to Cu. The electrical resistance of transistor 326S between its drain and source terminals may be adjusted by a gate voltage applied on its gate terminal 326G.

For example, and as shown in FIG. 3A, when a voltage level V1a is applied to the transistor gate terminal 326G, the transistor may be in a conductive state having a resistance. The resistance of the conductive state may be a predetermined value Ru by calibrating the transistor's resistance as a function of a gate voltage at its gate, and selecting a value V1a corresponding to Ru, although any suitable method for finding V1a based on a predetermined Ru may be used. When a voltage level V2a is applied to the transistor gate terminal 326G, the transistor may be in a high impedance state having a resistance that is more than 1,000×Ru, more than 10,000×Ru, more than 1,000,000×Ru, or approximately open circuit. V2a and V1a may be determined in similar ways and prior to operation of the attenuator, and may be provided as constant voltage levels by any suitable analog circuitry such as but not limited to a charge pump, an internal voltage reference using e.g. a resistor ladder, a replica bias circuit, or combinations thereof. As a result, Ru may be tunable based on V1a.

Of note, V1a and V2a are analog voltages, as opposed to digital logic levels that are associated with logic high '1' and logic low '0' in the electronic device. Being able to apply analog voltages to the gate terminal 326G allows the transistor resistance to be continuously tunable.

Figure 3B:
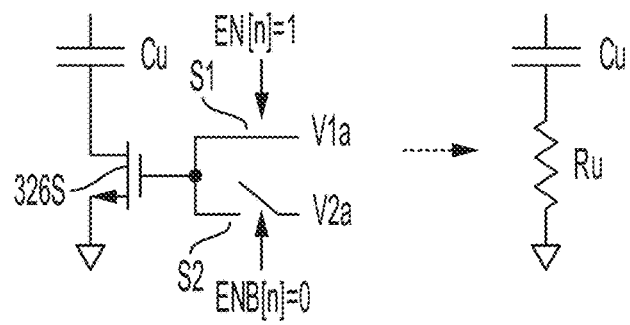
FIGS. 3B and 3C show schematic circuit diagrams of an exemplary circuit slice of FIG. 3A that is enabled/disabled, respectively.
Figure 3C:
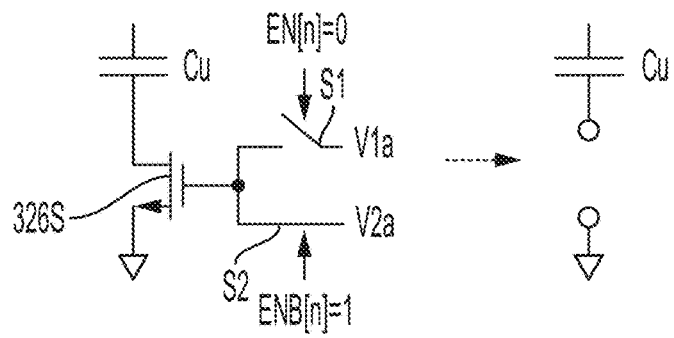

Referring back to FIG. 3A, which shows the circuit slice further includes a pair of switches S1 and S2 that are operable to connect one of V1a and V2a to the gate terminal 326G. FIGS. 3B and 3C show schematic circuit diagrams of an exemplary circuit slice of FIG. 3A that is enabled/disabled, respectively. In FIG. 3B, switch S1 is closed in response to an enable signal EN[n]=1, while switch S2 is open in response to a disable signal ENB[n]=0. As a result, V1a is applied to the gate terminal of transistor 326S such that the transistor is in a conductive state having a predetermined resistance Ru. In FIG. 3C, switch S1 is open in response to an enable signal EN[n]=0, while switch S1 is closed in response to a disable signal ENB[n]=1. As a result, V2a is applied to the gate terminal of transistor 326S such that the transistor is in an open circuit state.

EN[n] may be one of a plurality of enable signals EN[1], EN[2] . . . . EN[N] that each is provided to a switch in a respective circuit slice that couples V1a to the gate terminal of the transistor in the circuit slice. ENB[n] may be one of a plurality of disable signals ENB[1], ENB [2] . . . . ENB [N] that each is provided to a switch in a respective circuit slice that couples V2a to the gate terminal of the transistor in the circuit slice. The enable and disable signals may be digital signals generated by one or more controllers (not shown) in the electronic device 200. Any suitable signal control, routing, switching, multiplexing scheme may be used in the electronic device 200 to apply the enable and disable signals to the switches S1, S2, and to couple V1a, V2a to each gate terminal.

Switches S1 and S2 within a circuit slice may be implemented in any known technique such that they are controllable by the enable and disable signals to be in a closed state or an open circuit. For example, switches S1, S2 may be implemented with transistors, while embodiments of the present application are not so limited. In some embodiments, for each circuit slice, the enable and disable signals may be exclusive such that only one of S1 and S2 may be closed at a time.

Figure 3D:
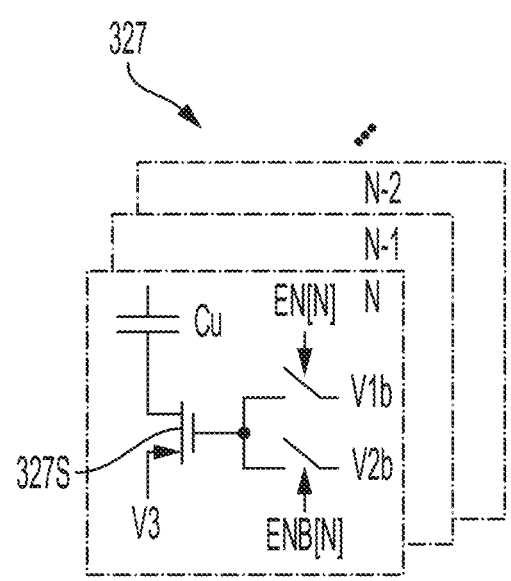
FIG. 3D shows a variation of the group of circuit slices in FIG. 3A, but with P-channel metal-oxide semiconductor transistors (PMOS), in accordance with some embodiments.

While FIG. 3A shows an NMOS transistor in the circuit slice, any transistor with a tunable resistance may be used. For example, FIG. 3D shows a variation of the group of circuit slices in FIG. 3A, but with P-channel metal-oxide semiconductor transistors (PMOS) 327S, in accordance with some embodiments.

Some aspects of the present application provide an attenuator having a tunable gain over a wide bandwidth, as well as a tunable input impedance. As should be appreciated from the attenuator circuit as shown in FIG. 2, at least two aspects of the attenuator are adjustable or programmable. First, the number of enabled circuit slices n may be programmed based on the enable and disable signals to be any value between 0 and N. Second, within each circuit slice the resistance Ru may be adjusted to be at a predetermined resistance based on V1a. As discussed in more detail below, the adjustability in such embodiments may permit tuning of various characteristics of the attenuator.

Figure 4A:
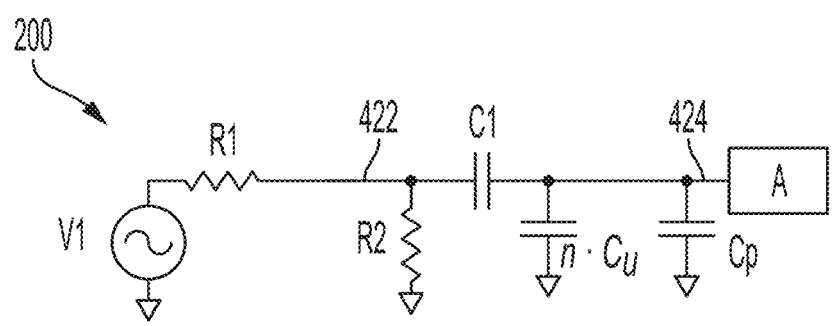
FIG. 4A shows a schematic circuit diagram of a low frequency equivalent circuit of the electronic device in FIG. 2 at low frequency.

FIG. 4A shows a schematic circuit diagram of a low frequency equivalent circuit of the electronic device 200 in FIG. 2 at low frequency. In FIG. 4A, n of the N circuit slices in attenuator 226 have been enabled, and the figure shows an equivalent circuit for signal V1 or a low frequency component of signal V1 having a low frequency such as less than 1 GHz or less than 0.1 GHz. An attenuator gain $G_1$ is defined as a ratio of an output signal amplitude at output node 424 with an input signal amplitude V1, and may be calculated as:

$$G_1 = \left(\frac{R_2}{R_1+R_2}\right) \times \left(\frac{C_1}{C_1+n \cdot C_u+C_p}\right),$$

where $C_p$ represents parasitic capacitance within the electronic device. For example, $C_p$ may represent an input capacitance of the amplifier 230. At low frequency, the parallel capacitance $nC_u$ for the n enabled circuit slices dominate contribution to G1, and $R_u$ within the enabled circuit slices can be omitted.

As should be appreciated from FIG. 4A, at low frequency the attenuator behaves as a voltage divider with a capacitor network. $G_1$ may be tuned by adjusting the number of enabled slices n and selecting the capacitor $C_u$ within each circuit slice.

Figure 4B:
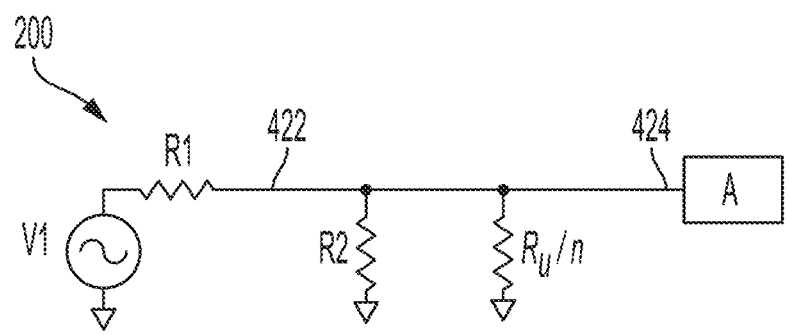
FIG. 4B shows a schematic circuit diagram of a high frequency equivalent circuit of the attenuator in FIG. 2 at high frequency.

FIG. 4B shows a schematic circuit diagram of a high frequency equivalent circuit of the attenuator in FIG. 2 at high frequency. In FIG. 4B, n of the N circuit slices in attenuator 226 have been enabled, and the figure shows an equivalent circuit for signal V1 or a high frequency component of signal V1 having a high frequency such as more than 1 GHz, more than 10 GHz. At high frequency, capacitor $C_u$ behave similarly to a short circuit, and the attenuator gain $G_2$ may be calculated as:

$$G_2 = \left(\frac{R_2 \cdot R_u}{R_2 \cdot R_u + R_1 \cdot R_u + n \cdot R_1 \cdot R_2}\right).$$

As should be appreciated from FIG. 4B, while at high frequency the attenuator behaves as a parallel combination of R2 and $R_u$/n. Unlikely the capacitor only divider whose impedance is inversely proportional to the frequency, the input impedance of the resistor network in FIG. 4B is constant over frequency. As a result, reflection at the input node to the attenuator may be reduced and signal integrity through the electronic device may be improved. Furthermore, because there is no resistor between the input node and the output node, the attenuator is shorted between input node and output node at high frequency, such that bandwidth limit due to series resistor in a Pi-network attenuator can be eliminated. Moreover, the lumped capacitor model n·Cu in FIG. 4A does not appear as a dominant impedance block at high frequency, which may lead to improved signal bandwidth at 422.

In FIG. 4B, the attenuator's high frequency attenuator gain $G_2$ may be tuned by adjusting the number of enabled slices n and selecting the resistance $R_u$ within each circuit slice. In some embodiments, $C_u$ and $R_u$ may be selected such that $G_1 = G_2$, such that the attenuator gain is approximately uniform across a wide bandwidth range from the low frequency in FIG. 4A to the high frequency in FIG. 4B. The selected $R_u$ may be implemented in any suitable ways, such as but not limited to tuning a resistance of a transistor 326S to a predetermined value as discussed above in relation to FIG. 3A. Meanwhile, the selected $C_u$ may also be implemented in any suitable ways now known or will be known in the future, such as by providing one or more passive capacitor components sized during manufacturing of the attenuator, or with a tunable capacitor. Once a wideband attenuator is formed after selecting appropriate $C_u$ and $R_u$ to make $G_1 = G_2$, the attenuator gain level can be controlled by changing the number n of enabled circuit slices. For example, a higher n will make both G1 and G2 lower.

It should be appreciated that while FIG. 2, FIG. 3A and FIG. 3D illustrates each circuit slice in the attenuator circuit as having identical serial capacitors and transistors, embodiments of the present application are not so limited. As a variation, each circuit slice doesn't need to have identical construction. For example, when enabled, the conductive state resistance of the transistor within some circuit slices may be different from others. In such examples, the N circuit slices may comprise segmented groups of slices connected in parallel, each slice having a tiered resistances. The segmented groups of slices may be selectively enabled or disabled to provide a suitable high frequency impedance based on permutations of segmented binary bits. Alternatively or in addition, $C_u$ may be different in some circuit slices than in others, and one or more such circuit slices may be selectively enabled or disabled to provide a suitable effective capacitance connecting the output node to ground in the attenuator circuit.

Figure 5:
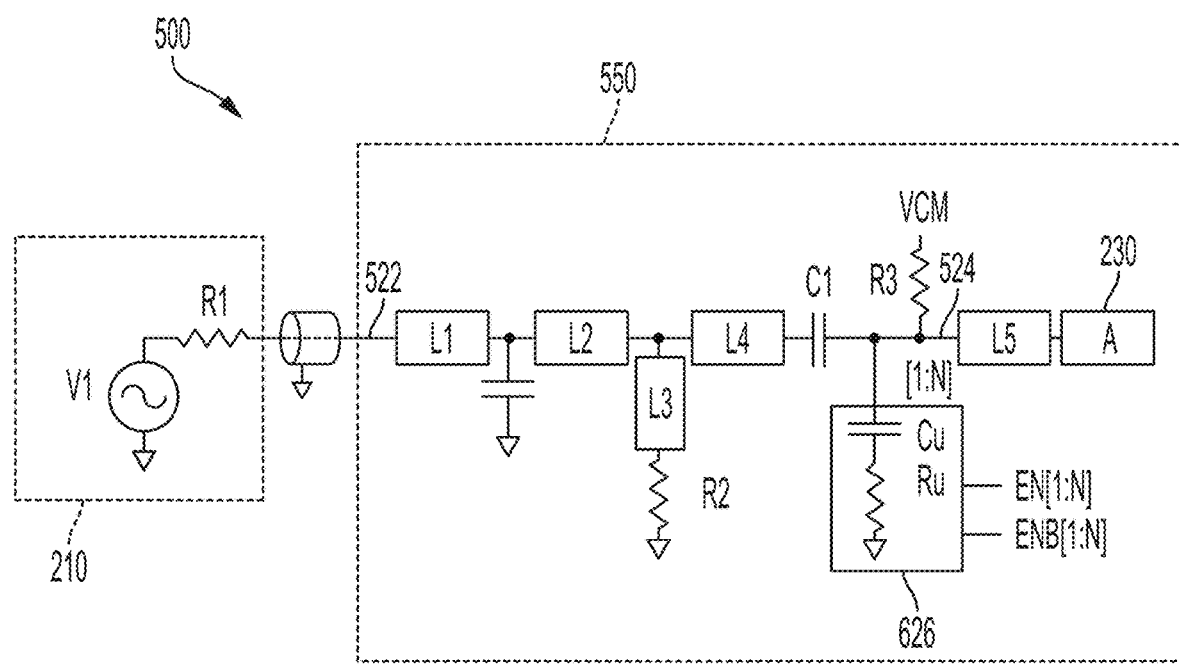
FIG. 5 shows a schematic circuit diagram of an electronic device that is a variation of the electronic device in FIG. 2, in accordance with some embodiments.

FIG. 5 shows a schematic circuit diagram of an electronic device 500 that is a variation of the electronic device 200 in FIG. 2, in accordance with some embodiments. in accordance with some embodiments. Device 500 comprises a receiver 550 coupled to transmitter 210, differs from device 200 in that a biasing resistor R3 is added that connects output node 524 to common mode voltage VCM at frequency lower than 1 MHz, lower than 100 kHz, lower than 50 kHz. R3 does not impact the two gain equations G1 and G2. Further, an inductor network comprising L1, L2, L3, L4 and L5 are provided between input node 522 and amplifier 230.

Figure 6:
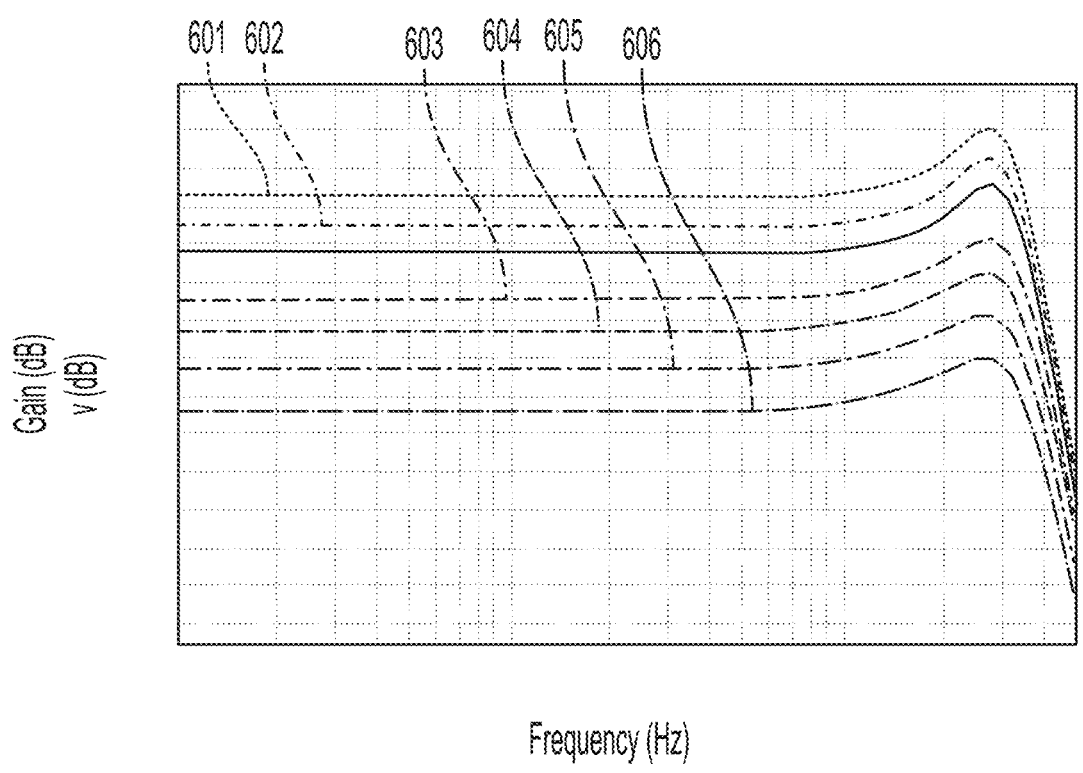
FIG. 6 shows a series of simulated attenuator gain curves from the electronic device in FIG. 5, in accordance with some embodiments.

FIG. 6 shows a series of simulated attenuator gain curves from the electronic device 500 in FIG. 5, in accordance with some embodiments. Each of the attenuator gain curve 601, 602, 603, 604, 605 and 606 corresponds to a growing number of enabled slices n within circuit slices 626 as shown in FIG. 5. For curve 601, all slices are disabled. Gain curve 601 thus may represent a case where the attenuator is turned off and the attenuator gain is 0 dB. Each of curves 602-606 has 4, 8, 16, 22, 30, and 40 slices enabled, respectively. FIG. 6 illustrates that for a particular frequency, the attenuator gain decreases with increase of n, while the gain control preserves the shape of the 0 dB gain curve 601. Looking at the shape of gain curve 601, which is representative of all the gain curves, the frequency response is approximately flat over a frequency band spanning several orders of magnitude with a variation of no more than 1 dB. Therefore the attenuator circuit within electronic device 500 can provide a wideband attenuation with a tunable attenuator gain based on the number of enabled circuit slices.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An attenuator circuit, comprising:
an input node;
an output node;
at least one capacitor connected in series between the input node and the output node; and
a plurality of circuit slices connected in parallel between the output node and a reference voltage node, individual circuit slices of the plurality of circuit slices comprising a capacitor in series with a tunable resistor.

2. The attenuator circuit of claim 1,
the attenuator circuit has an attenuator gain that is programmable by setting the tunable resistor in some or all circuit slices of the plurality of circuit slices to be in a conductive state having a predetermined resistance, and the tunable resistor in one or more remaining circuit slices of the plurality of circuit slices in a high impedance state.

3. The attenuator circuit of claim 2, wherein for each circuit slice of the some or all circuit slices, the predetermined resistance is selected such that a difference between a first value of the attenuator gain at a first frequency and a second value of the attenuator gain at a second frequency different from the first frequency is no more than 1 dB.

4. The attenuator circuit of claim 3, wherein the first frequency is less than 1 GHz and the second frequency is higher than 1 GHz.

5. The attenuator circuit of claim 4, wherein the first frequency is less than 0.1 GHz and the second frequency is higher than 10 GHz.

6. The attenuator circuit of claim 2, wherein the high impedance state is an open circuit.

7. The attenuator circuit of claim 1, wherein for each circuit slice:
the tunable resistor is a transistor having a gate terminal configured to apply a gate voltage such that the transistor has a tunable resistance.

8. The attenuator circuit of claim 7, wherein each circuit slice further comprises one or more switches configured to switchably connect the gate terminal of the transistor to a first voltage such that the transistor is in a high impedance state or a second voltage such that the transistor is in a conductive state having a pre-determined resistance.

9. The attenuator circuit of claim 1, further comprising:
a capacitor coupled to the input node and the output node.

10. An electronic device, comprising:
an attenuator having a gain between an attenuator output and an attenuator input, the attenuator comprising:
a plurality of circuit slices connected in parallel between the attenuator output and a reference voltage node, individual circuit slices of the plurality of circuit slices comprising a capacitor in series with a transistor having a tunable resistance; and
at least one capacitor connected in series between the attenuator input and the attenuator output.

11. The electronic device of claim 10, wherein:
the gain is programmable by selectively tuning the transistor in some or all circuit slices of the plurality of circuit slices to be in a conductive state, and the transistor in one or more remaining circuit slices of the plurality of circuit slices in a high impedance state.

12. The electronic device of claim 11, wherein for each circuit slice of the some or all circuit slices, the transistor has a predetermined resistance such that a difference between the gain at a first frequency and the gain at a second frequency is no more than 1 dB, wherein the first frequency is less than 1 GHz and the second frequency is more than 1 GHz.

13. The electronic device of claim 12, wherein the first frequency is less than 0.1 GHz and the second frequency is more than 10 GHz.

14. The electronic device of claim 10, wherein for each circuit slice: the transistor has a gate terminal configured to apply a gate voltage such that the transistor has a pre-determined resistance.

15. The electronic device of claim 14, wherein each circuit slice further comprises one or more switches coupled to the gate terminal of the transistor and configured to switchably connect the gate terminal to a first voltage such that the transistor is in a high impedance state or a second voltage such that the transistor is in a conductive state having a pre-determined resistance.

16. The electronic device of claim 10, further comprising an amplifier coupled to the attenuator, wherein the attenuator input is configured to receive an input signal, and the attenuator output is configured to provide an attenuated input signal to the amplifier.

17. The electronic device of claim 16, wherein the attenuator and the amplifier are part of an integrated circuit.

18. A method for operating an attenuator circuit that has an input, an output, and a plurality of circuit slices connected in parallel between the output and a reference voltage node, individual circuit slices of the plurality of circuit slices having a capacitor in series with a transistor having a tunable resistance, the method comprising:

selectively tuning the transistor in some or all circuit slices of the plurality of circuit slices to a conductive state to adjust an attenuator gain of the attenuator circuit; and flowing a current through at least one capacitor connected in series between the input and the output.

19. The method of claim 18, wherein selectively tuning the transistor in some or all circuit slices comprises:

setting the transistor to have a predetermined resistance such that a difference between a first value of the attenuator gain at a first frequency and a second value of the attenuator gain at a second frequency different from the first frequency is no more than 1 dB.

20. The method of claim 19, wherein setting the transistor to have a predetermined resistance comprises applying a predetermined voltage to a gate terminal of the transistor.

* * * * *